United States Patent
Garcia et al.

(10) Patent No.: US 6,703,647 B1
(45) Date of Patent: Mar. 9, 2004

(54) TRIPLE BASE BIPOLAR PHOTOTRANSISTOR

(75) Inventors: Graham A. Garcia, San Diego, CA (US); George P. Imthurn, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 41 days.

(21) Appl. No.: 10/131,442

(22) Filed: Apr. 22, 2002

(51) Int. Cl.[7] ............... H01L 31/0328; H01L 31/0336; H01L 31/072; H01L 31/109; H01L 29/00
(52) U.S. Cl. ............ 257/184; 257/108; 257/109; 257/164; 257/197; 257/461; 257/560; 257/563
(58) Field of Search ............ 257/21, 108, 109, 257/184, 197, 198, 200, 201, 164, 165, 461, 462, 560, 563

(56) References Cited

U.S. PATENT DOCUMENTS

| | | | |
|---|---|---|---|
| 4,001,866 A | * 1/1977 | Kravitz et al. | 357/39 |
| 4,334,196 A | 6/1982 | Schade, Jr. | |
| 4,620,210 A | * 10/1986 | Scavennec et al. | 357/30 |
| 4,649,409 A | 3/1987 | Roppongi et al. | |
| 4,835,587 A | 5/1989 | Sato et al. | |
| 4,843,448 A | 6/1989 | Garcia et al. | |
| 5,644,149 A | * 7/1997 | Streit | 257/147 |
| 5,677,551 A | * 10/1997 | Imamura et al. | 257/95 |
| 5,981,982 A | * 11/1999 | Driscoll | 257/138 |
| 5,994,162 A | 11/1999 | Burghartz et al. | |

* cited by examiner

Primary Examiner—Sheila V. Clark
Assistant Examiner—Jesse A. Fenty
(74) Attorney, Agent, or Firm—Allan Y. Lee; Michael A. Kagan; Peter A. Lipovsky

(57) ABSTRACT

A high gain phototransistor uses lateral and vertical transistor structures and a triple base. The base regions of two vertical structures are in the bulk of a semiconductor substrate while the base of a single lateral structure is adjacent a light receiving phototransistor surface. Minority carrier generation extends from the base region of the lateral transistor to the base regions of the vertical transistors and is present in the vertical regions within a diffusion length of the optically generated carriers of the lateral base. The bases of all three transistor structures are electrically connected. The collector electrodes of one of the vertical structures and the lateral structure are electrically connected, while the emitter electrodes of the other of the vertical structures and the lateral structures are electrically connected. Finally, the remaining vertical collector and emitter electrodes are electrically connected via a buried layer adjacent the phototransistor wafer substrate.

16 Claims, 2 Drawing Sheets

TRIPLE BASE BIPOLAR PHOTOTRANSISTOR

BACKGROUND OF THE INVENTION

This invention relates generally to phototransistors and more specifically to phototransistors designed for a high gain response. In greater specificity, but without limitation thereto, the invention pertains to a phototransistor that utilizes both lateral and vertical bipolar transistor structures.

A phototransistor is similar to a bipolar transistor in that it has an emitter, base, and collector. While the base current of a bipolar transistor is provided through an electrical contact, the base current of a phototransistor, as its name suggests, is provided through photons.

Because light must be coupled into the base of the phototransistor, the phototransistor must be fabricated so that its base region is adjacent to the surface of the semiconductor. A typical such structure is referred to as a "lateral" bipolar phototransistor, and is illustrated in FIG. 1. Photonic energy is absorbed at the surface of the base of this transistor. In distinction, a typical "vertical" bipolar transistor has a base region within the bulk of the semiconductor. This vertical design is illustrated in FIG. 2.

All semiconductors experience an increase in electron and hole (carrier) recombination near the semiconductor's surface. Such activity reduces carrier lifetime, and thereby, the gain of the transistor.

In manufacturing, the base width of vertical transistors can be precisely made, as this width is controlled by how deep impurities are implanted or how far they are diffused into the semiconductor. In a lateral transistor, however, the base width must be controlled by lithography, a more difficult and less precise process. By combining lateral and vertical structures in a phototransistor design, the advantages of both structures can be had and a high gain phototransistor can be realized.

SUMMARY OF THE INVENTION

The invention provides a high gain phototransistor incorporating the advantages of lateral and vertical bipolar transistor structures. The invention is configured with a triple base, wherein the base regions of the vertical transistor structures are provided in the bulk of a semiconductor substrate while the base region of the lateral transistor structure is made adjacent to a surface of the phototransistor. Light is received on this surface.

Minority carrier generation is not limited to the base region of the lateral transistor but also extends to the base regions of the vertical transistors. Minority carriers will be present in these vertical base regions within a diffusion length of the optically generated carriers of the lateral transistor base.

From an electrical perspective, the bases of all three transistor structures are electrically connected. The collector electrodes of one of the vertical structures and the lateral structure are electrically connected, while the emitter electrodes of the other of the vertical structures and the lateral structures are electrically connected. Finally, the remaining vertical collector and emitter electrodes are electrically connected via the buried layer adjacent the phototransistor wafer substrate.

An object of this invention is to provide a phototransistor of relatively high gain.

Another object of this invention is to provide a phototransistor that provides the benefits of lateral and vertical transistor structures.

Still another object of the invention is to provide a triple-base phototransistor.

Other objects, advantages and new features of the invention will become apparent from the following detailed description of the invention when considered in conjunction with the accompanied drawing.

DESCRIPTION OF THE PREFERRED EMBODIMENT

Figure 1:
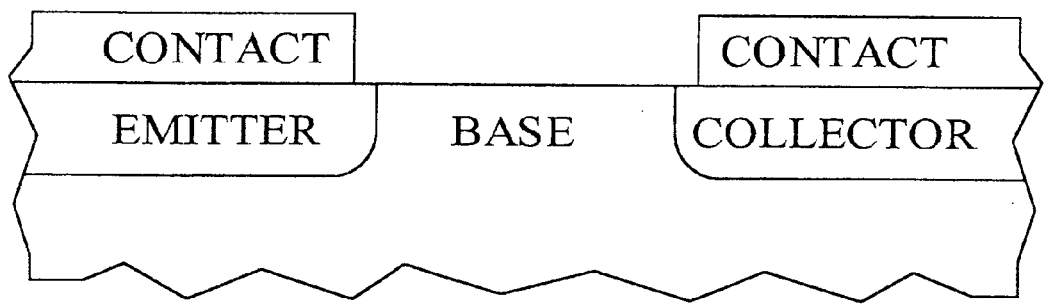
FIG. 1 illustrates key components of a prior art lateral bipolar phototransistor.
Figure 2:
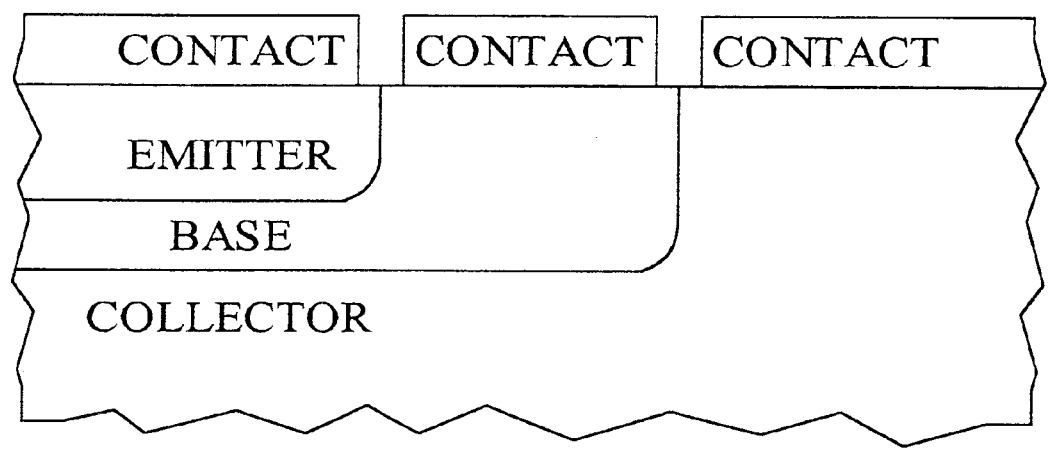
FIG. 2 illustrates key components of a prior art vertical bipolar transistor.
Figure 3:
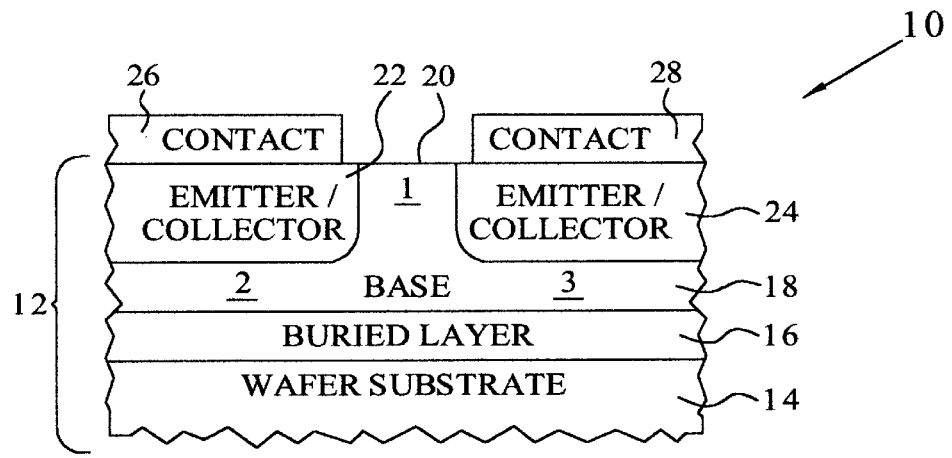
FIG. 3 shows a triple-base bipolar phototransistor according to one embodiment of the invention.

Referring to FIG. 3, a cross section of a triple-base bipolar phototransistor is shown. Phototransistor 10 includes a semiconductor substrate 12. Included within this substrate section is a wafer substrate 14 and a buried layer 16.

Disposed adjacent buried layer 16 is a transistor base region 18, a cross section of which has first, second and third "legs" identified as 1, 2 and 3 on this drawing. Leg 1 has a light receiving surface 20. Disposed adjacent these transistor base legs are first and second emitter/collector regions 22 and 24. No distinction is made in this figure between the emitter and collector regions, as the device of the invention may be fabricated symmetrically so as to function without direct current (DC) bias. Of course, in operation, one of the emitter/collector regions will serve as the emitter and the other of the emitter/collector regions will function as the collector. Emitter/collector contacts 26 and 28 are positioned to provide electrical connection to emitter/collectors 22 and 24, respectively.

Figure 4:
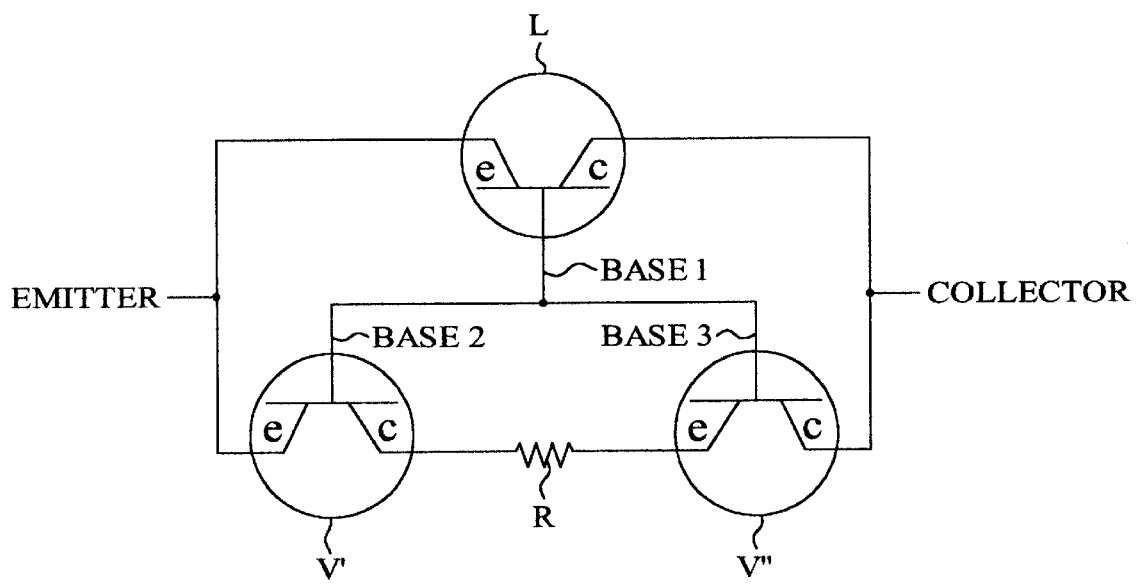
FIG. 4 is an electrical schematic equivalent for the triple base phototransistor of the invention shown in FIG. 3.

FIG. 4 is a schematic drawing of the three transistors which make up the device. As can be seen in this figure, the bases of all three transistor structures are electrically connected. The collector electrodes (c) of one of the vertical structures (V") and the lateral structure (L) are electrically connected, while the emitter electrodes (e) of the other of the vertical structures (V') and the lateral structure (L) are electrically connected. Finally, the remaining vertical collector and emitter electrodes are electrically connected via the buried layer adjacent the phototransistor wafer substrate. The latter connection is depicted as made through a resistance (R) of the buried layer.

An exemplary process for making an example of the triple-base phototransistor of the invention is shown in Table 1. This process consists of the following steps:

TABLE 1

| | |
|---|---|
| A | PROVIDE SUBSTRATE |
| B | IMPLANT/DEPOSIT BURIED LAYER IN/ON SUBSTRATE |
| C | IMPLANT/DEPOSIT BASE REGION IN/ON BURIED LAYER |
| D | MASK INVERSE IMAGE OF EMITTER/COLLECTOR REGIONS |
| E | DOPE EMITTER/COLLECTOR REGIONS |
| F | PROVIDE ELECTRICAL CONTACTS TO EMITTER/COLLECTOR REGIONS |

The specific doping levels, implant depths, processing temperatures, and film thicknesses may be varied to optimize the phototransistor for any specific application. The choice of using implantation or deposition is also within the discretion of one skilled in the art.

The operation of the triple-base phototransistor is similar to most phototransistors in that surface 20 of base region 1 is illuminated to provide minority carriers. At first it may appear that there are no minority carriers generated in vertical base regions 2 and 3 because light is blocked from entering these regions by the emitter/collector contacts. However, minority carriers will be present in these regions within a diffusion length of the optically generated carriers in base region 1. According to S. M. Sze, as stated in *"Physics of Semiconductor Devices"* (John Wiley & Sons, New York, 1981), pp. 30–38, the diffusion length of holes and electrons in semiconductors is defined as follows:

$$L \equiv \sqrt{\frac{kT}{q}\mu\tau}$$

Where L is the diffusion length of the average carrier in the semiconductor, k is Boltzmann's constant, T is the temperature of the semiconductor, q is the electron charge, $\mu$ g is the carrier mobility, and $\tau$ is the carrier recombination lifetime. For silicon or germanium, as examples, the diffusion length L is on the order of tens of microns. In various other semiconductor materials the diffusion length is shorter, but long enough so that if base region 1 is made small enough, the triple-base phototransistor will function.

The triple-base phototransistor of the invention can be fabricated using any semiconductor substrate. Because of their long carrier lifetimes, silicon or germanium lend themselves as suitable substrate materials. By way of example, an NPN triple-base phototransistor may be fabricated in silicon comprising the steps according of Table 2.

TABLE 2

| | |
|---|---|
| A | PROVIDE SUBSTRATE |
| B | IMPLANT N+ BURIED LAYER AS LAYER IN SUBSTRATE |
| C | ACTIVATE IMPLANT |
| D | DEPOSIT P TYPE EPITAXIAL LAYER (TRANSISTOR BASE) |
| E | GROW SILICON DIOXIDE LAYER |
| F | MASK INVERSE IMAGE OF EMITTER/COLLECTORS IN PHOTORESIST |
| G | ETCH AWAY SILICON DIOXIDE IN EMITTER/COLLECTOR REGIONS |
| H | IMPLANT N+ EMITTER/COLLECTOR REGIONS |
| I | REMOVE MASKING MATERIAL |
| J | ACTIVATE IMPLANT |
| K | MAKE ELECTRICAL CONTACTS TO EMITTER/COLLECTOR REGIONS |

Of course, a PNP phototransistor can also be fabricated according to the invention by alternating conductivity types used. A triple-base phototransistor according to the invention may also be fabricated in an alloy of silicon and germanium, in order to take advantage of the shorter absorption depths of visible and near-infrared light in such alloys as compared to silicon. This substitution will increase the number of carriers in the triple base region for a given level of illumination. Another implementation of the triple-base phototransistor is a heterojunction bipolar phototransistor, wherein the base region consists of a different semiconductor than the emitter/collectors and buried layer. Such an approach could be fabricated, for example, in GaAs with an AlGaAs base or in Si with a SiGe base. The band gap structure in these heterojunction bipolar transistors improves their performance over standard bipolar transistors. The advantages of the heterojunction design is fast switching speed and short photon absorption depth. If the triple-base phototransistor is to be used as a switch for microwave signals, it is advantageous to form the phototransistor on an insulating or high resistivity wafer substrate in order to reduce microwave losses into this substrate. Thus, using the proper processing operations, the phototransistor might be formed on semi-insulating GaAs, semi-insulating InP, high-resistivity silicon, or any of the various silicon-on-insulator technologies available.

Obviously, many modifications and variations of the invention are possible in light of the above description. It is therefore to be understood that within the scope of the claims the invention may be practiced otherwise than as has been specifically described.

What is claimed is:

1. A phototransistor comprising:
   a substrate base;
   a buried layer of a first conductivity type disposed adjacent said substrate base;
   a base region of a second conductivity type disposed adjacent said buried layer, wherein said base region includes a light receiving surface;
   first and second emitter/collector regions disposed adjacent said base region, said first and second emitter/collector regions of said first conductivity type; and
   first and second electrical contacts operably coupled to said first and second emitter/collector regions, respectively;
   wherein said base region has a cross-section that includes three legs, the first of which is disposed between said first and second emitter/collector regions and that terminates at one end at said light receiving surface, the second and third said legs being disposed between said first emitter/collector and said buried layer and between said second emitter/collector and said buried layer, respectively.

2. The phototransistor of claim 1 wherein said phototransistor includes a substrate, said substrate comprising said substrate base, said buried layer, said base region and said first and second emitter/collector regions, wherein said substrate is of silicon.

3. The phototransistor of claim 1 wherein said phototransistor includes a substrate, said substrate comprising said substrate base, said buried layer, said base region and said first and second emitter/collector regions, wherein said substrate is of germanium.

4. The phototransistor of claim 1 wherein said phototransistor includes a substrate, said substrate comprising said substrate base, said buried layer, said base region and said first and second emitter/collector regions, wherein said substrate is of an alloy of silicon and germanium.

5. The phototransistor of claim 1 wherein said buried layer and said emitter/collector regions are of gallium-arsenide and said base region is of aluminum-gallium-arsenide.

6. The phototransistor of claim 1 wherein said buried layer and said emitter/collector regions are of silicon and said base region is of silicon-germanium.

7. The phototransistor of claim 1 wherein said phototransistor includes a substrate, said substrate comprising said substrate base, said buried layer, said base region and said first and second emitter/collector regions, wherein said substrate is semi-insulating.

8. The phototransistor of claim 7 wherein said substrate is semi-insulating gallium-arsenide.

9. The phototransistor of claim 7 wherein said substrate is semi-insulating indium-phosphorous.

10. The phototransistor of claim 1 wherein said phototransistor includes a substrate, said substrate comprising said substrate base, said buried layer, said base region and said first and second emitter/collector regions, wherein said substrate is a silicon-on-insulator substrate.

11. The phototransistor of claim 1 wherein said lateral and vertical bipolar transistor structures are NPN type.

12. The phototransistor of claim 1 wherein said lateral and vertical bipolar transistor structures are PNP type.

13. The phototransistor of claim 1 wherein minority carriers are generated in said first leg of said base and within said second and third legs of said base within a distance L of said minority carriers generated in said first leg of said base, wherein L, the diffusion length of the average carrier in the semiconductor, is defined as follows:

$$L \equiv \sqrt{\frac{kT}{q}\mu\tau}$$

where k is Boltzmann's constant, T is the temperature of the semiconductor, q is the electron charge, $\mu$ is the carrier mobility, and $\tau$ is the carrier recombination lifetime.

14. A phototransistor comprising:
- a lateral bipolar transistor structure having emitter, base and collector electrodes;
- a first vertical bipolar transistor structure having emitter, base and collector electrodes;
- a second vertical bipolar transistor structure having emitter, base and collector electrodes; and
- first and second electrical contacts;
- wherein said emitter electrodes of said lateral bipolar transistor structure and said first vertical bipolar transistor structure are electrically connected to said first electrical contact, said collector electrodes of said lateral bipolar transistor structure and said second vertical bipolar transistor structure are electrically connected to said second electrical contact, said collector electrode of said first vertical bipolar transistor structure is electrically connected to said emitter electrode of said second vertical bipolar transistor structure, and said base electrodes of said transistor structures are electrically connected;
- wherein minority carriers are generated in a first leg of a base and within a second leg and a third leg of said base within a distance L of said minority carriers generated in said first leg of said base, wherein L, the diffusion length of the average carrier in the semiconductor, is defined as follows:

$$L \equiv \sqrt{\frac{kT}{q}\mu\tau}$$

where k is Boltzmann's constant, T is the temperature of the semiconductor, q is the electron charge, $\mu$ is the carrier mobility, and $\tau$ is the carrier recombination lifetime.

15. The phototransistor of claim 14 wherein said lateral and vertical bipolar transistor structures are NPN type.

16. The phototransistor of claim 14 wherein said lateral and vertical bipolar transistor structures are PNP type.

* * * * *